United States Patent
Hsieh et al.

(10) Patent No.: US 9,147,679 B2
(45) Date of Patent: Sep. 29, 2015

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Tzu-Yen Hsieh, Taipei (TW);
Ming-Ching Chang, Hsinchu (TW);
Yuan-Sheng Huang, Taichung (TW);
Ming-Chia Tai, Hsinchu County (TW);
Chao-Cheng Chen, Shin-Chu (TW)

(73) Assignee: Taiwan Semiconductor Manufacturing Company, ltd., Hsin-Chu (TW)

( * ) Notice: Subject to any disclaimer, the term of this patent is extended or adjusted under 35 U.S.C. 154(b) by 0 days.

(21) Appl. No.: 14/230,779

(22) Filed: Mar. 31, 2014

(65) Prior Publication Data
US 2014/0284724 A1 Sep. 25, 2014

Related U.S. Application Data

(63) Continuation of application No. 13/471,649, filed on May 15, 2012, now Pat. No. 8,691,655.

(51) Int. Cl.
*H01L 27/06* (2006.01)

(52) U.S. Cl.
CPC ..... *H01L 27/0629* (2013.01); *H01L 2924/0002* (2013.01)

(58) Field of Classification Search
CPC .................................................. H01L 27/9629
USPC .......................................................... 257/379
See application file for complete search history.

(56) References Cited

U.S. PATENT DOCUMENTS

| | | | |
|---|---|---|---|
| 8,524,556 B1 * | 9/2013 | Chiou et al. | 438/238 |
| 2004/0203214 A1 * | 10/2004 | Iizuka et al. | 438/384 |
| 2006/0246654 A1 | 11/2006 | Shin | |
| 2007/0096183 A1 * | 5/2007 | Ogawa et al. | 257/300 |
| 2007/0184606 A1 * | 8/2007 | You et al. | 438/211 |
| 2008/0206939 A1 | 8/2008 | Min et al. | |
| 2010/0327343 A1 * | 12/2010 | Salcedo et al. | 257/328 |
| 2010/0328022 A1 * | 12/2010 | Fan et al. | 338/309 |
| 2013/0149849 A1 * | 6/2013 | Nandakumar | 438/532 |
| 2013/0200393 A1 | 8/2013 | Chen et al. | |

* cited by examiner

*Primary Examiner* — Christine Enad
(74) *Attorney, Agent, or Firm* — Haynes and Boone, LLP

(57) ABSTRACT

A method of fabricating a semiconductor integrated circuit (IC) is disclosed. The method includes receiving a semiconductor device, patterning a first hard mask to form a first recess in a high-resistor (Hi-R) stack, removing the first hard mask, forming a second recess in the Hi-R stack, forming a second hard mask in the second recess in the Hi-R stack. A HR can then be formed in the semiconductor substrate by the second hard mask and a gate trench etch.

19 Claims, 7 Drawing Sheets

METHOD OF SEMICONDUCTOR INTEGRATED CIRCUIT FABRICATION

PRIORITY DATA

The present application is a continuation application of U.S. patent application Ser. No. 13/471,649, filed on May 15, 2012, entitled "METHOD OF SEMICONDUCTOR INTEGRATED CIRCUIT FABRICATION", the disclosure of which is hereby incorporated by reference in its entirety.

BACKGROUND

The semiconductor integrated circuit (IC) industry has experienced exponential growth. Technological advances in IC design and material have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, high-k (HK) dielectric material and metal gate (MG) are often considered to form a gate stack for a field-effect transistor (FET). Integration issues occur when forming various metal-gate FETs onto a single IC circuit, especially when resistors are integrated in the circuit. For example, a gate replacement process used for a HKMG typically includes an etch process to remove a polysilicon gate. However, any polysilicon resistors can be damaged and recessed by the etch process, causing the deviation of the resistance of the polysilicon resistor from the designed target. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
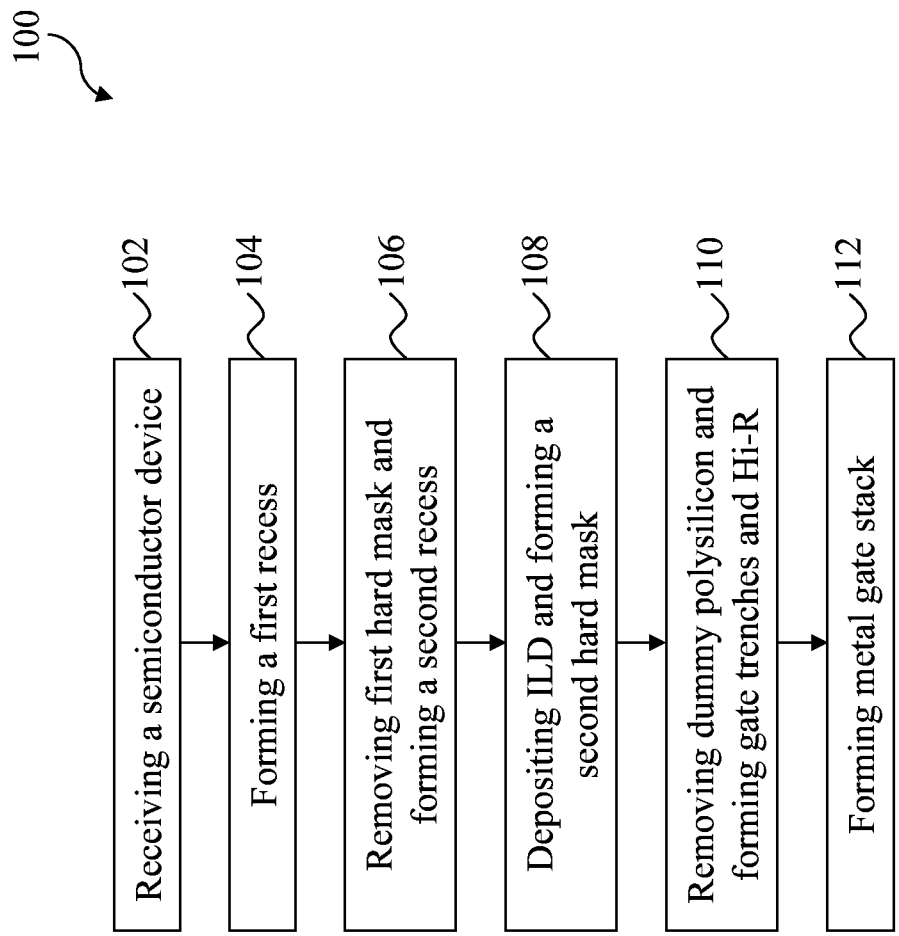
FIG. 1 is a flowchart of an example method for fabricating a semiconductor integrated circuit (IC) constructed according to various aspects of the present disclosure.
Figure 2:
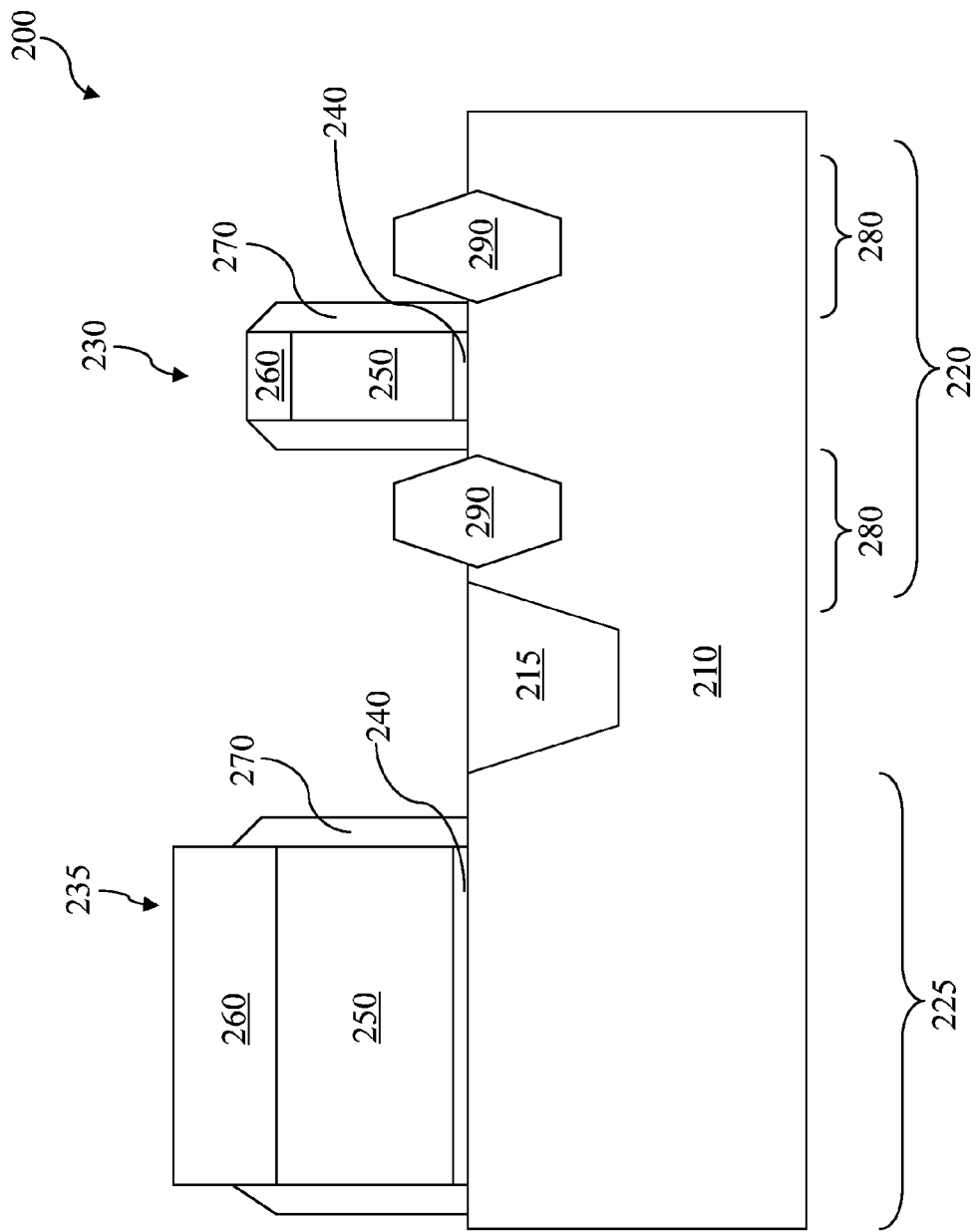
FIGS. 2, 3, 4, 5, 6 and 7 are cross-sectional views of an example semiconductor integrated circuit (IC) at fabrication stages constructed according to the method of FIG. 1.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 and 7 for the sake of example.

The method 100 begins at step 102 by receiving a semiconductor device 200. In the present embodiment shown in FIG. 2, the semiconductor device 200 is a field-effect transistor (FET) device. The semiconductor device 200 includes a semiconductor substrate 210. The semiconductor substrate 210 may include silicon, germanium, silicon germanium, gallium arsenide or other appropriate semiconductor materials. Alternatively, the semiconductor substrate 210 may include an epitaxial layer. For example, the semiconductor substrate 210 may have an epitaxial layer overlying a bulk semiconductor. Further, the semiconductor substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the semiconductor substrate 210 may include a semiconductor-on-insulator (SOI) structure such as a buried dielectric layer. Also alternatively, the semiconductor substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device 200 also includes various isolation features 215. The isolation features 215 separate various device regions in the semiconductor substrate 210. The various device regions include a FET region 220 and an input/output high-resistor (IO Hi-R) region 225. The isolation features 215 include different structures formed by using different processing technologies. For example, the isolation features 215 may include shallow trench isolation (STI) features. The formation of a STI may include etching a trench in the semiconductor substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 215.

The semiconductor device 200 may also include various doped regions (not shown) formed by implantation techniques. For example, a portion of the semiconductor substrate 210 is doped to form a P-type region and formed a P-well where a n-channel device will be fabricated. Similarly, another portion of the semiconductor substrate 210 is doped to form a N-type region and formed a N-well where a p-channel device will be fabricated. The doped regions are doped with P-type dopants, such as boron or BF2, and/or N-type dopants, such as phosphorus or arsenic. The doped regions may be formed directly on the semiconductor substrate 210, in a P-well structure, in an N-well structure, in a dual-well structure, or using a raised structure.

In the present disclosure, a replacement gate (RPG) process scheme is employed. Generally, in a RPG process scheme, a dummy polysilicon gate is formed first and is replaced later by a MG after high thermal budget processes are performed. In the present disclosure, the semiconductor device 200 also includes a dummy gate stack 230 in the FET region 220 and an I/O Hi-R stack 235 in the I/O Hi-R region 225. The dummy gate stack 230 and the Hi-R stack 235 may be formed simultaneously. In one embodiment, the dummy gate stack 230, as well as the Hi-R stack 235, includes a dielectric layer 240 deposited on the semiconductor substrate 210. The dielectric layer 240 may include an interfacial layer (IL) deposited by any appropriate method, such as atomic layer deposition (ALD), chemical vapor deposition CVD and ozone oxidation. The IL includes oxide, HfSiO and oxynitride. It has been observed that an IL may provide a remedy for some HK dielectric gate stack integration issues, such as threshold voltage pinning and reducing carrier mobility. The IL may also be important as a diffusion barrier to prevent undesirable interface reactions between the HK dielectric material and the substrate.

The dielectric layer 240 may also include a HK dielectric layer deposited on the IL by suitable techniques, such as ALD, CVD, metalorganic CVD (MOCVD), physical vapor deposition (PVD), thermal oxidation, combinations thereof, or other suitable techniques. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials. A post HK layer deposition annealing may be performed to enhance moisture control in gate dielectrics.

The dummy gate stack 230, as well as the Hi-R stack 235, also includes a gate material 250, such as polysilicon, disposed over the dielectric layer 240 by deposition techniques known in the art. Alternatively, an amorphous silicon layer may optionally be formed instead of the polysilicon layer. The gate material 250 may be referred to as a dummy polysilicon 250 since it will be replaced with a metal gate electrode in downstream processes.

The dummy gate stack 230, as well as the Hi-R stack 235, also includes a patterned first hard mask 260 formed on the dummy polysilicon 250 to define dummy gate stack 230 and the Hi-R stack 235. The patterned first hard mask 260 includes silicon nitride and/or silicon oxide, or alternatively photoresist. The patterned first hard mask 260 may include multiple layers. The first hard mask 260 are patterned by a photolithography process and an etching process.

Next, the dummy polysilicon 250 is etched, by using the patterned first hard mask 260 as an etch mask, to form the dummy gate stack 230 and the Hi-R stack 235. The etching process includes a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., C12, CHC13, CC14, and/or BC13), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile. After the etch, the remain thickness of the first hard mask 260 may be different on the dummy gate stack 230 comparing to those on the Hi-R stack 235. For example, the remain thickness of the first hard mask 260 in the Hi-R is thicker than the one in the dummy gate stack 230.

The semiconductor device 200 also includes sidewall spacers 270 formed on the sidewalls of the dummy gate stack 230 and the Hi-R stack 235. The sidewall spacers 270 may include a dielectric material such as silicon oxide. Alternatively, the sidewall spacers 270 may include silicon nitride, silicon carbide, silicon oxynitride, or combinations thereof. The sidewall spacers 270 may be formed by deposition and dry etching processes known in the art.

The semiconductor device 200 also includes source/drain (S/D) regions 280 in the FET region 220. The S/D regions 280 are formed by a proper technique, such as one or more ion implantations. The S/D regions 280 may further include lightly doped (LDD) and a heavily doped regions. After the formation of the source and drain (S/D) regions 280, one or more annealing processes may be performed. The annealing processes may include rapid thermal anneal (RTA), laser anneal, or other suitable annealing processes. As an example, a high-temperature thermal anneal step that may apply temperatures anywhere in the range of 900 C-1100 C, though other embodiments may use temperatures within a different range. As another example, high-temperature anneal includes a "spike" annealing process that has a very short time duration.

In one embodiment, the S/D regions 280 include epitaxially grown semiconductor material to from strained structures 290 for a proper strain effect, leading to enhance carrier mobility. For example, silicon germanium is epitaxially grown in the S/D regions 280 for a p-type FET (PFET). For another example, silicon carbide is epitaxially. grown in the S/D regions 280 for a n-type FET (NFET). The method to form the strained structure 290 includes etching to form recesses in the semiconductor substrate 210 and epitaxially growth to form a crystalline semiconductor material in the recesses.

Figure 3:
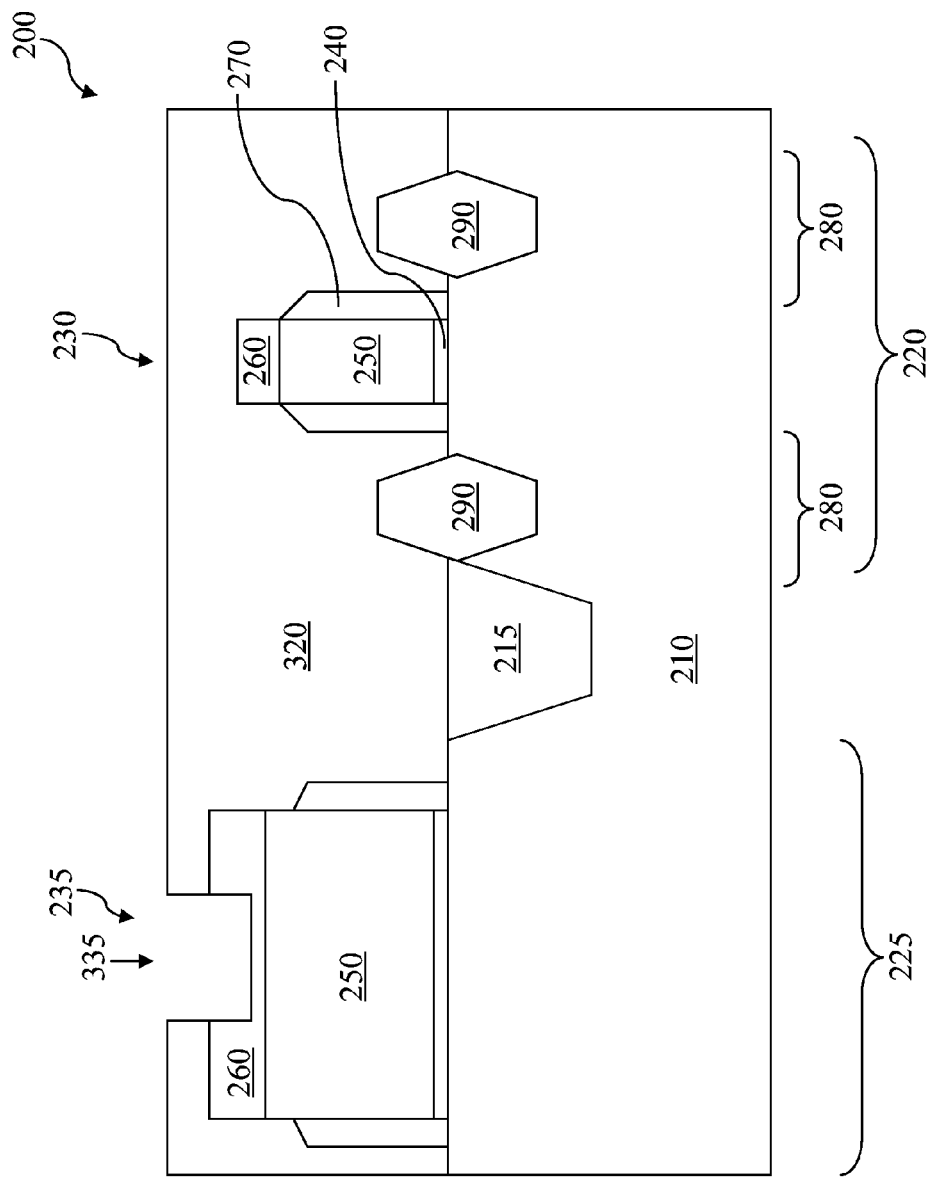

Referring FIGS. 1 and 3, the method 100 proceeds to step 104 by patterning the first hard mask 260 and forming a first recess 335 in the Hi-R stack 235. The first hard mask 260 is patterned by photolithography and etching processes. A photoresist layer 320 is coated on the first hard mask 260 and patterned by exposing and developing processes. The patterned photoresist 320 defines an opening in the Hi-R stack 235. A portion of the first hard mask 260 is removed through the opening of the photoresist 320 to from the first recess 335 in the Hi-R stack 235. The first hard mask 260 is etched by a suitable etching process, such as a plasma dry etch. The depth of the first recess 335 is controlled to satisfy downstream processes, which will be described in details later.

Figure 4:
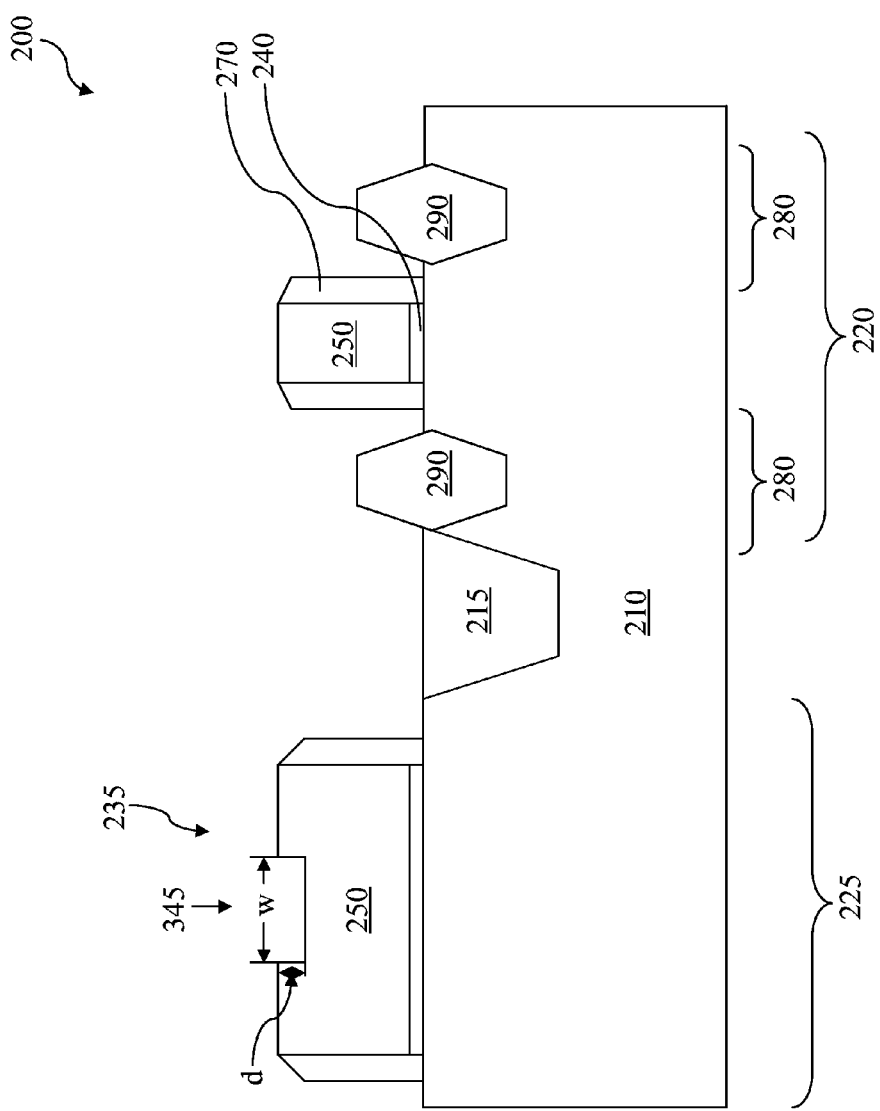

Referring to FIGS. 1 and 4, the method 100 proceeds to step 106 by removing the first hard mask 260 and material from a second recess 345 in the Hi-R stack 235. The first hard mask 260 is removed by an etching process such as a wet etch, a dry etch or a combination of dry and wet etch. In the present embodiment, the first hard mask 260 is removed by a plasma dry etch. During the etch, the portion of the first hard mask 260 in the first recess region is etched out completely before other portions of the first hard mask 260 being etching out. As the etching process continues to etch the rest of the first hard mask 260, the portion of the dummy polysilicon 250 in the first recess region 335 is etched to form a second recess 345 in the dummy polysilicon 250 in the Hi-R region. The width (w) and the depth (d) of the second recess 345 are affected not only by the on-going etching but also by the depth of the first recess 335 in the previous step. As mentioned previously, the depth of the first recess 335 is determined to achieve a target width (w) and depth (d) of the second recess 345. In downstream processes, the w of the second recess 345 will be used to define a critical dimension (CD) of the Hi-R and the d of the second recess 345 will be used to define an adequate thickness dimension for a second hard mask, which will be described in detail below.

Figure 5:
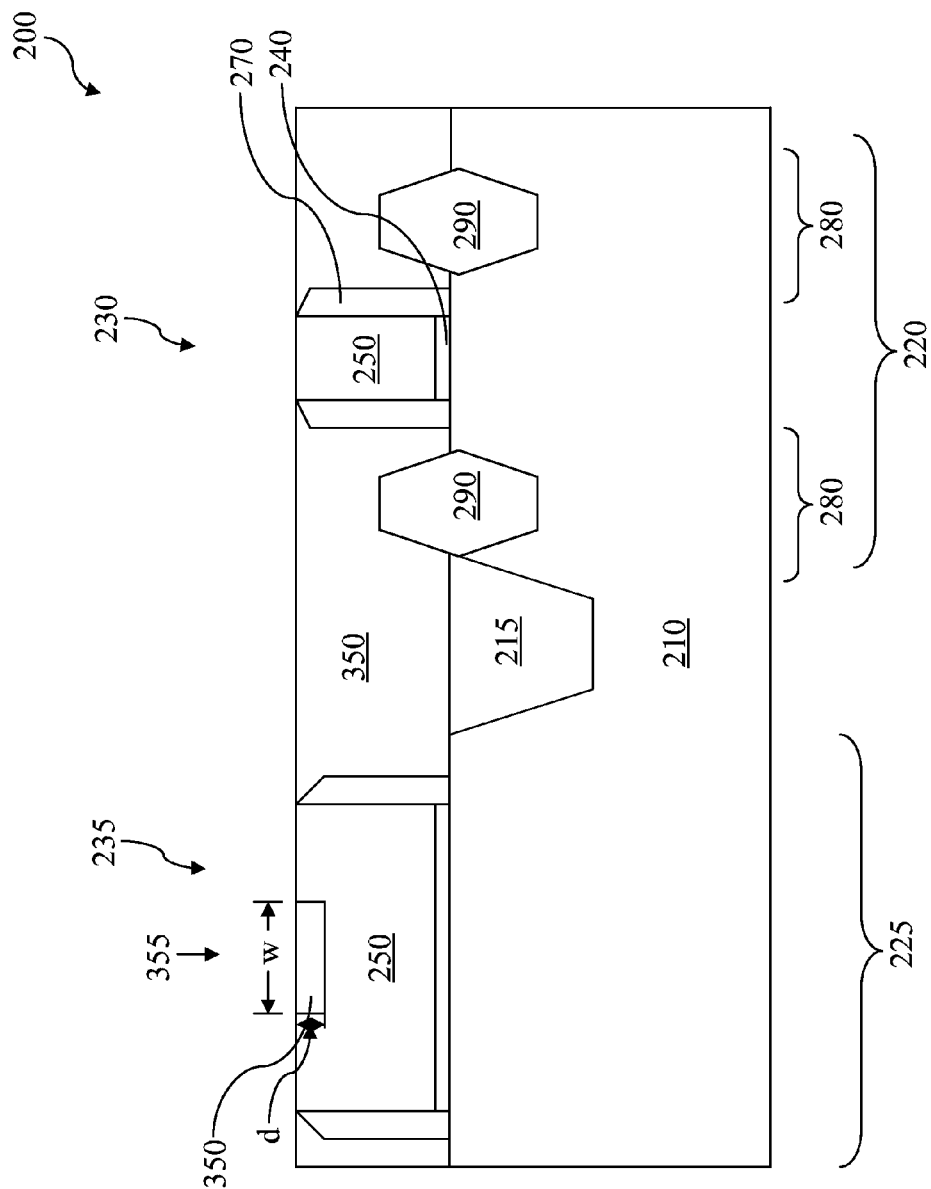

Referring to FIGS. 1 and 5, the method 100 proceeds to step 108 by depositing an interlayer dielectric (ILD) layer 350 on the semiconductor substrate 210 and forming a second hard mask 355 in the Hi-R stack 235. The ILD layer 350 includes silicon oxide, oxynitride or other suitable materials. The ILD layer 350 includes a single layer or multiple layers. The ILD layer 350 is formed by a suitable technique, such as CVD, ALD and spin-on (SOG). The ILD layer 350 fills in gaps between the dummy gate stack 230 and the Hi-R stack 235. The ILD layer 350 also fills in the second recess 345. A chemical mechanical polishing (CMP) process is performed to remove excess material in the ILD layer 350. A depth of the CMP is controlled such that the dummy polysilicon 250 is exposed while an adequate portion of the ILD layer 350 remains in the second recess 345. The remaining ILD layer 350 in the second recess 345 will serve as a second hard mask 355 in a downstream etching process. A thickness of the second hard mask 355 is controlled not only by the CMP process but also by the d of the second recess 345.

In order to enhance CMP process control, such as polishing uniformity control, a dielectric stack may be disposed under the ILD layer 350. The CMP is performed to remove excessive material in the ILD layer 350 and the dielectric stack. A depth of the CMP is controlled such that the dummy polysilicon 250 is exposed while an adequate portion of the dielectric stack (and/or the ILD layer 350) remains in the second recess 345. The dielectric stack may include a single layer, such as a silicon nitride layer, or multiple layers. The remaining portion of the dielectric stack (and/or portion of the ILD layer 350) in the second recess 345 will serve as a second hard mask 355 in a downstream etching process.

Figure 6:
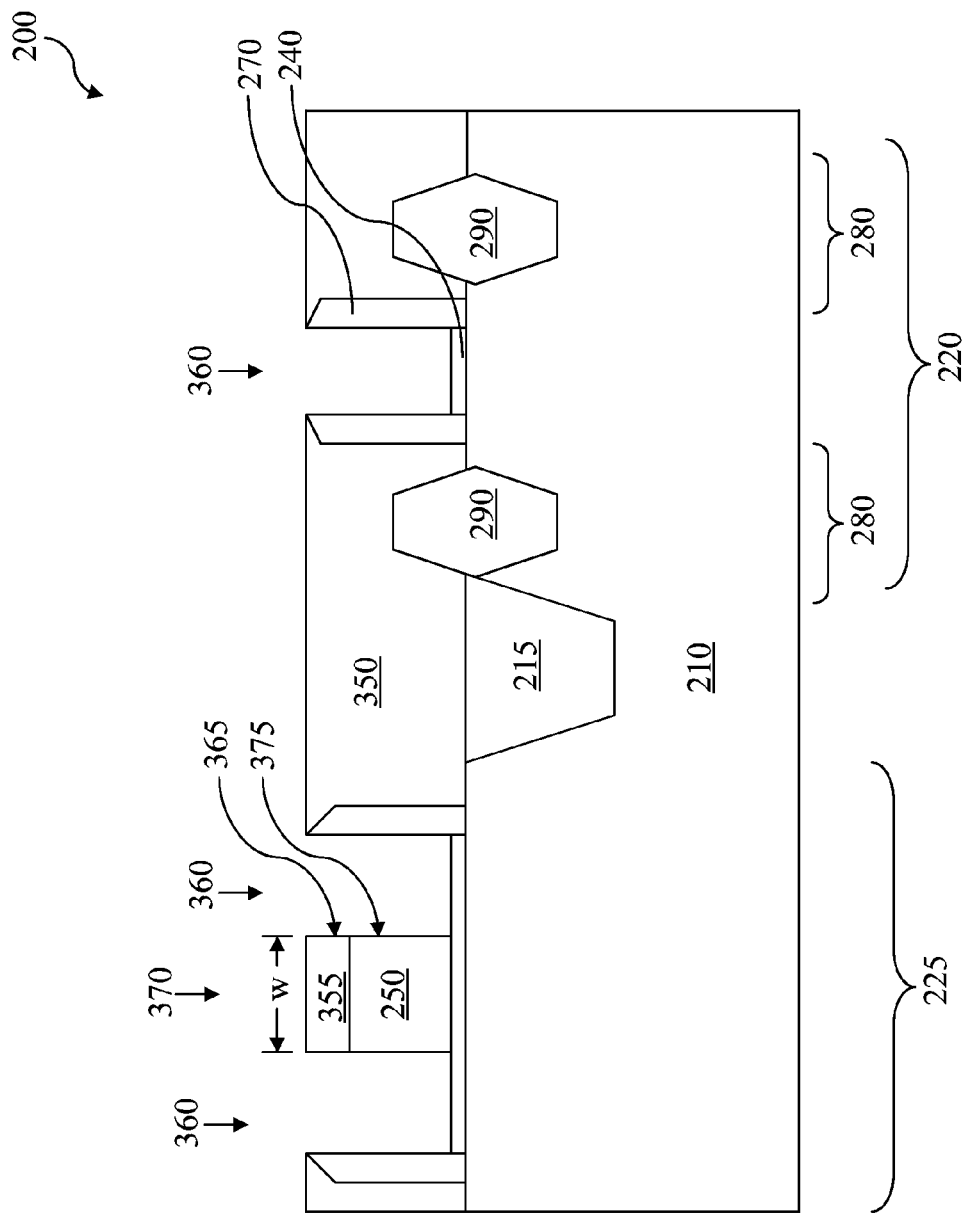

Referring to FIGS. 1 and 6, the method 100 proceeds to step 110 by removing dummy polysilicon 250 to form gate trenches 360 and a Hi-R 370 in the semiconductor substrate 210. The dummy polysilicon 250 may be removed by dry etch, wet etch, or a combination of dry and wet etch. For example, a wet etch process may include exposure to a hydroxide containing solution (e.g., ammonium hydroxide), deionized water, and/or other suitable etchant solutions. During the removal of the dummy polysilicon layer 250, an adequate etch selectivity with respect to the second hard mask 355 provides a self-alignment nature in forming the Hi-R 370 such that the edge 375 of the Hi-R 370 substantially aligns to the edge 365 of the second hard mask 355. This self-alignment formation of the Hi-R 370 provides a better CD and profile control. With the second hard mask 355, the Hi-R 370 also obtains self-protection for any future dummy polysilicon etch, which may otherwise need an additional patterned photomask to protect the Hi-R 370.

Figure 7:
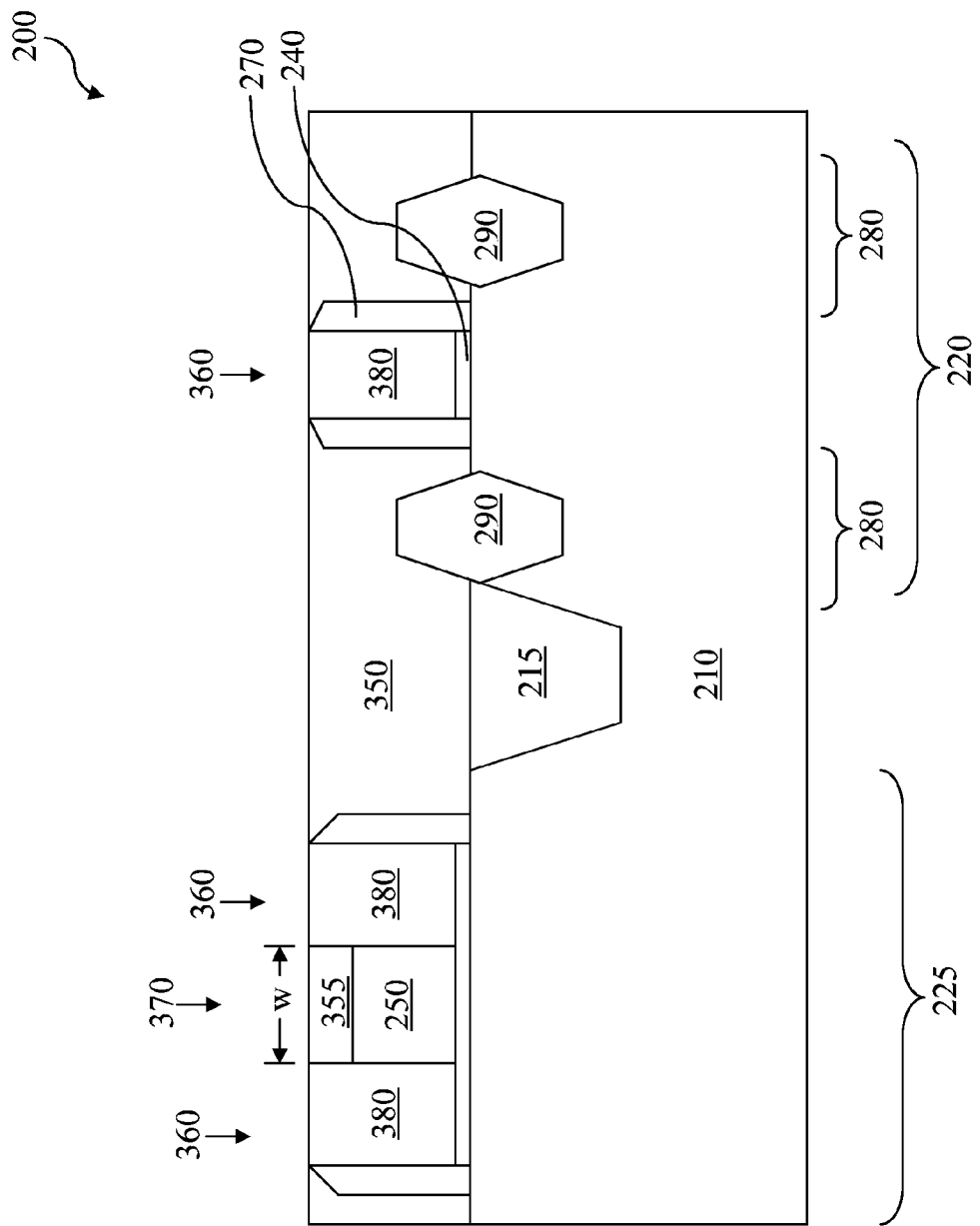

Referring to FIGS. 1 and 7, the method 100 proceeds to step 112 by forming metal gate (MG) stacks 380 in the gate trenches 360. The MG stacks 380 are formed by filling in the gate trenches 360 with MG materials. The MG stacks 380 may include a single layer or multi layers, such as metal layer, liner layer, wetting layer, and adhesion layer. The MG stacks 380 may include Ti, Ag, Al, TiAlN, TaC, TaCN, TaSiN, Mn, Zr, TiN, TaN, Ru, Mo, Al, WN, Cu, W, or any suitable materials. The MG stacks 380 may be formed by ALD, PVD, CVD, or other suitable process. A CMP may be performed to remove excessive MG stacks 380 materials. The CMP process may have a high selectivity of metal layers selectivity with respect to the ILD layer 350. The CMP provides a substantially planar top surface for the metal gate stacks 380 and the ILD layer 350.

The method 100 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

Based on the above, it can be seen that the present disclosure offers a method of forming hybrid resistor in a replacement gate (RPG) process flow. The method provides a hybrid resistor formation with a self-alignment nature to improve Hi-R CD control and reduce Hi-R resistance variation. The method also provides a hybrid resistor with a self-protection hard mask structure to simplify RPG processes.

The present disclosure provides many different embodiments of fabricating a semiconductor IC that provide one or more improvements over the prior art. In one embodiment, a method for fabricating a semiconductor integrated circuit (IC) includes receiving a semiconductor device. The semiconductor device includes a semiconductor substrate having a field-effect transistor (FET) region and a high resistor (Hi-R) region, a dummy gate stack with a first hard mask as an uppermost layer in the FET region and a Hi-R stack with a first hard mask as an uppermost layer in the Hi-R region. The method also includes patterning the first hard mask layer to form a first recess in the Hi-R stack, removing the first hard mask, forming a second recess in the Hi-R stack, forming a second hard mask in the second recess in the Hi-R stack and forming gate trench etches and a Hi-R in the semiconductor substrate.

In another embodiment, a method for fabricating a semiconductor IC includes receiving a semiconductor device. The semiconductor device includes a semiconductor substrate, a dummy gate stack with a first hard mask and a Hi-R stack with the first hard mask in the semiconductor substrate. The method also includes etching the first hard mask to form a first recess in the Hi-R stack, removing the first hard mask and forming a second recess in the Hi-R stack, filling in the second recess with an ILD layer, performing a chemical mechanical polishing (CMP) to expose the dummy polysilicon layer and form a second hard mask in the Hi-R stack and forming a Hi-R and forming gate trenches in the semiconductor substrate.

In yet another embodiment, a method for fabricating a semiconductor IC includes receiving a semiconductor device. The semiconductor device includes a semiconductor substrate, a dummy polysilicon gate stack with a first hard mask and a dummy polysilicon Hi-R stack with the first hard mask in the semiconductor substrate, sidewall spacers formed on sidewalls of the dummy polysilicon gate stack and the dummy polysilicon Hi-R stack. The method also includes forming a first recess in the first hard mask in the dummy polysilicon Hi-R stack, then removing the first hard mask and forming a second recess in the dummy polysilicon Hi-R stack, filling in the second recess with an ILD layer. performing a chemical mechanical polishing (CMP) to expose the dummy polysilicon layer and form a second hard mask in the dummy polysilicon Hi-R stack, forming a dummy polysilicon Hi-R, forming gate trenches in the semiconductor substrate and filling gate trenches with metal gate materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
a semiconductor substrate; and
a resistor stack disposed over the semiconductor substrate, the resistor stack including:
 a first dielectric layer disposed over the semiconductor substrate;
 a gate material layer disposed over the first dielectric layer;
 metal layers disposed over the first dielectric layer and on sides of the gate material layer; and
 a dielectric stack disposed over the gate material layer, an interlayer dielectric (ILD) layer having a first portion disposed adjacent the resistor stack and a second portion disposed directly on top of the dielectric stack above the gate material layer, wherein an upper surface of the second portion of the ILD layer is substantially coplanar with upper surfaces of the metal layers and an upper surface of the first portion of the ILD layer is substantially coplanar with the upper surface of the second portion of the ILD layer.

2. The IC structure of claim 1, wherein the gate material layer includes a conductive layer.

3. The IC structure of claim 1, wherein the gate material layer includes an amorphous silicon layer.

4. The IC structure of claim 1, wherein an edge of the second portion of the ILD layer aligns with an edge of the gate material layer.

5. The IC structure of claim 1, wherein the metal layers are disposed on sidewalls of the second portion of the ILD layer and sidewalls the gate material layer.

6. The IC structure of claim 1, wherein the metal layers include one material selected from the group consisting of Ti, Ag, Al, TiAlN, TaC, TaCN, TaSiN, Mn, Zr, TiN, TaN, Ru, Mo, Al, WN, Cu, W, and a combination thereof.

7. The IC structure of claim 1, wherein the first dielectric layer includes one material selected from the group consisting of LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), and a combination thereof.

8. The IC structure of claim 1, further comprising:
sidewall spacers formed on sidewalls of the metal layers and on sidewalls of the first dielectric layer.

9. The IC structure of claim 1, further comprising:
a transistor stack disposed over the semiconductor substrate, the transistor stack including:
 a second dielectric layer formed over the semiconductor substrate;
 a metal gate formed over the second dielectric layer; and
 sidewall spacers disposed on sidewalls of the metal gate and on sidewalls of the second dielectric layer.

10. The IC structure of claim 9, wherein the portions of the ILD layer is disposed between the resistor stack and the transistor stack, wherein an upper surface of the metal gate is substantially coplanar with the upper surface of the portion of the ILD layer.

11. The IC structure of claim 10, wherein the upper surfaces of the metal layers are substantially coplanar with the upper surface the first portion of the ILD layer.

12. The IC structure of claim 9, wherein the metal layers include substantially similar materials as the metal gate.

13. The IC structure of claim 9, wherein the second portion of the ILD layer includes one material selected from the group consisting of silicon oxide, oxynitride, silicon nitride, and a combination thereof.

14. An integrated circuit (IC) structure, comprising:
a semiconductor substrate;
a resistor stack disposed over the semiconductor substrate, the resistor stack including:
 a first dielectric layer disposed over the semiconductor substrate;
 a conductive layer disposed over the first dielectric layer;
 a dielectric stack disposed over the conductive layer; and
 metal layers disposed over the first dielectric layer and along sidewalls of the conductive layer;
a transistor stack disposed over the semiconductor substrate, the transistor stack including:
 a second dielectric layer disposed over the semiconductor substrate;
 a metal gate disposed over the second dielectric layer; and
a first portion of an interlayer dielectric (ILD) layer disposed between the resistor stack and the transistor stack and a second portion of the ILD layer is disposed directly on top of the dielectric stack,
wherein an upper surface of the second portion of the ILD layer, an upper surface of the first portion of the ILD layer, and an upper surface of the metal layers are substantially coplanar.

15. The IC structure of claim 14, further comprising:
first sidewall spacers disposed on sidewalls of the metal layers of the resistor stack; and
second sidewall spacers disposed on sidewalls of the metal gate and the second dielectric layer of the transistor stack.

16. The IC structure of claim 14, further comprising:
source and drain regions disposed on two sides of the transistor stack.

17. The IC structure of claim 16, wherein the source and drain regions include epitaxially grown strained structures.

18. The IC structure of claim 14, wherein the semiconductor substrate includes an isolation feature.

19. An integrated circuit (IC) structure, comprising:
a semiconductor substrate;
an input/output high-resistor (IO Hi-R) region including a conductive layer and a dielectric stack disposed on the conductive layer;
a field-effect transistor (FET) region including a metal gate;
an isolation feature disposed between the IO Hi-R region and the FET region; and
a first portion of an interlayer dielectric (ILD) layer disposed over the isolation feature and a second portion of the ILD layer is disposed directly on top of the dielectric stack,
wherein an upper surface of the second portion of the ILD layer is substantially coplanar with an upper surface of the metal gate, wherein an upper surface of the first portion of the ILD layer is substantially coplanar with the upper surface of the second portion of the ILD layer,
wherein the IO Hi-R region further includes metal layers formed on sidewalls of the conductive layer and the second portion of the ILD layer, and
wherein the upper surface of the second portion of the ILD layer is substantially coplanar with upper surfaces of the metal layers.

* * * * *